(12) United States Patent
Okudaira et al.

(10) Patent No.: US 12,248,244 B2
(45) Date of Patent: Mar. 11, 2025

(54) MASK DATA GENERATION METHOD AND MASK DATA GENERATION PROGRAM

(71) Applicant: NIKON CORPORATION, Tokyo (JP)

(72) Inventors: Yosuke Okudaira, Konosu (JP); Satoshi Yashiki, Chigasaki (JP)

(73) Assignee: NIKON CORPORATION, Tokyo (JP)

( * ) Notice: Subject to any disclaimer, the term of this patent is extended or adjusted under 35 U.S.C. 154(b) by 445 days.

(21) Appl. No.: 17/796,813

(22) PCT Filed: Feb. 18, 2021

(86) PCT No.: PCT/JP2021/006127
§ 371 (c)(1),
(2) Date: Aug. 1, 2022

(87) PCT Pub. No.: WO2021/167005
PCT Pub. Date: Aug. 26, 2021

(65) Prior Publication Data
US 2023/0048772 A1     Feb. 16, 2023

(30) Foreign Application Priority Data
Feb. 19, 2020     (JP) .................... 2020-026419

(51) Int. Cl.
*G03F 1/70*     (2012.01)
*G06F 30/398*     (2020.01)

(52) U.S. Cl.
CPC .............. *G03F 1/70* (2013.01); *G06F 30/398* (2020.01)

(58) Field of Classification Search
CPC .... G03F 1/70; G03F 7/70508; G03F 7/70291; G06F 30/398
See application file for complete search history.

(56) References Cited

U.S. PATENT DOCUMENTS

| | | | |
|---|---|---|---|
| 7,407,252 B2 * | 8/2008 | Chabreck | G03F 7/70383 358/1.9 |
| 2013/0263063 A1 * | 10/2013 | Inoue | G03F 1/70 716/54 |

(Continued)

OTHER PUBLICATIONS

PCT/JP2021/006127 English translation, May 18, 2021, pp. 1-3. (Year: 2021).*

(Continued)

*Primary Examiner* — Stacy Whitmore
(74) *Attorney, Agent, or Firm* — Oliff PLC

(57) ABSTRACT

A mask data generation method including: calculating first evaluation value of projection image based on first mask data in which first value or second value different from first value is set for each of a plurality of unit elements that constitute 2-dimensional grid; generating second mask data by changing value of first unit element to which first value is set to second value and by changing value of second unit element which is disposed close to first unit element on 2-dimensional grid and to which second value is set to first value, among the plurality of unit elements included in the first mask data; calculating second evaluation value of projection image based on the second mask data; and comparing the first evaluation value and the second evaluation value and selecting either the first mask data or the second mask data as output mask data based on the comparison result.

24 Claims, 5 Drawing Sheets

(56) References Cited

U.S. PATENT DOCUMENTS

| | | | | |
|---|---|---|---|---|
| 2014/0365985 | A1* | 12/2014 | Ishii | G03F 1/70 |
| | | | | 430/5 |
| 2017/0024510 | A1* | 1/2017 | Shin | G06F 30/398 |
| 2020/0019052 | A1* | 1/2020 | Swanson | G03F 1/70 |
| 2020/0117104 | A1* | 4/2020 | Hino | G06F 30/30 |
| 2020/0192996 | A1* | 6/2020 | Kang | G06F 30/398 |

OTHER PUBLICATIONS

Translated document (Year: 2021).*
Liu, Yong et al., "Binary and Phase-shifting Image Design for Optical Lithography", Proceedings of SPIE, (1991), vol. 1463, pp. 382-399.
May 18, 2021 Written Opinion of the International Searching Authority issued in Patent Application No. PCT/JP2021/006127.
May 18, 2021 International Search Report issued in Patent Application No. PCT/JP2021/006127.

* cited by examiner (a)

(b)

(a)

(b)

MASK DATA GENERATION METHOD AND MASK DATA GENERATION PROGRAM

TECHNICAL FIELD

The present invention relates to a mask data generation method, and a mask data generation program.

BACKGROUND ART

In a mask used for semiconductor lithography or the like, a so-called pixel base mask in which one mask pattern is formed with a plurality of discrete pixels, rather than continuous polygonal shapes is, has been proposed. As a method of generating a pixel pattern in such a pixel base mask, for example, a method related to Non Patent Literature 1 has been proposed.

CITATION LIST

Patent Literature

[Non Patent Literature]
[Non Patent Literature 1]
Liu Y, Zakhor, "A. Binary and phase-shifting image design for optical lithography", Proceedings of SPIE, (US), SPIE, Jul. 1, 1991, Volume 1463, Optical/Laser Microlithography IV, p. 382-399

SUMMARY OF INVENTION

According to a first aspect, a mask data generation method includes calculating a first evaluation value of a projection image based on first mask data to which a first value or a second value different from the first value is set for each of a plurality of unit elements that constitute a 2-dimensional grid; generating second mask data by changing a value of a first unit element to which the first value is set to a second value and by changing a value of a second unit element which is disposed close to the first unit element on the 2-dimensional grid and to which the second value is set to the first value, among the plurality of unit elements included in the first mask data; calculating a second evaluation value of the projection image based on the second mask data; and comparing the first evaluation value and the second evaluation value and selecting either the first mask data or the second mask data as output mask data on the basis of the comparison result.

According to a second aspect, a mask data generation program is configured to cause a data processing device including a computer to perform: storing first mask data to which a first value or a second value different from the first value is set for each of a plurality of unit elements that constitute a 2-dimensional grid in a storage region; calculating a first evaluation value of a projection image based on the first mask data; generating second mask data by changing a value of a first unit element to which the first value is set to a second value and by changing a value of a second unit element which is disposed close to the first unit element on the 2-dimensional grid and to which the second value is set to the first value, among the plurality of unit elements included in the first mask data; calculating a second evaluation value of a projection image based on the second mask data; and comparing the first evaluation value and the second evaluation value and selecting either the first mask data or the second mask data as output mask data on the basis of the comparison result.

DESCRIPTION OF EMBODIMENTS

First Embodiment

Figure 1:
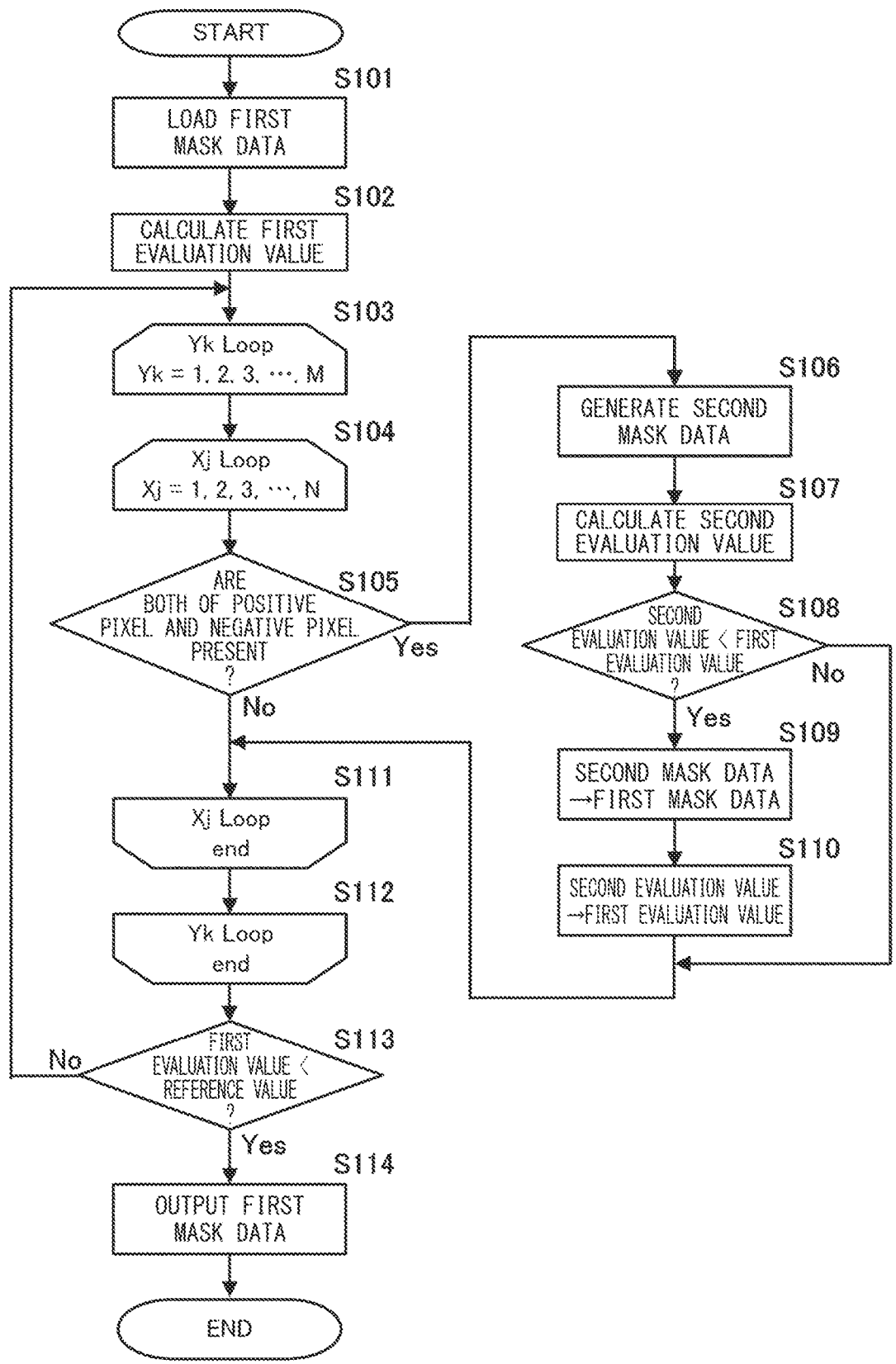
FIG. 1 is a view showing a flowchart expressing a processing process of a mask data generation method of a first embodiment.
Figure 2:
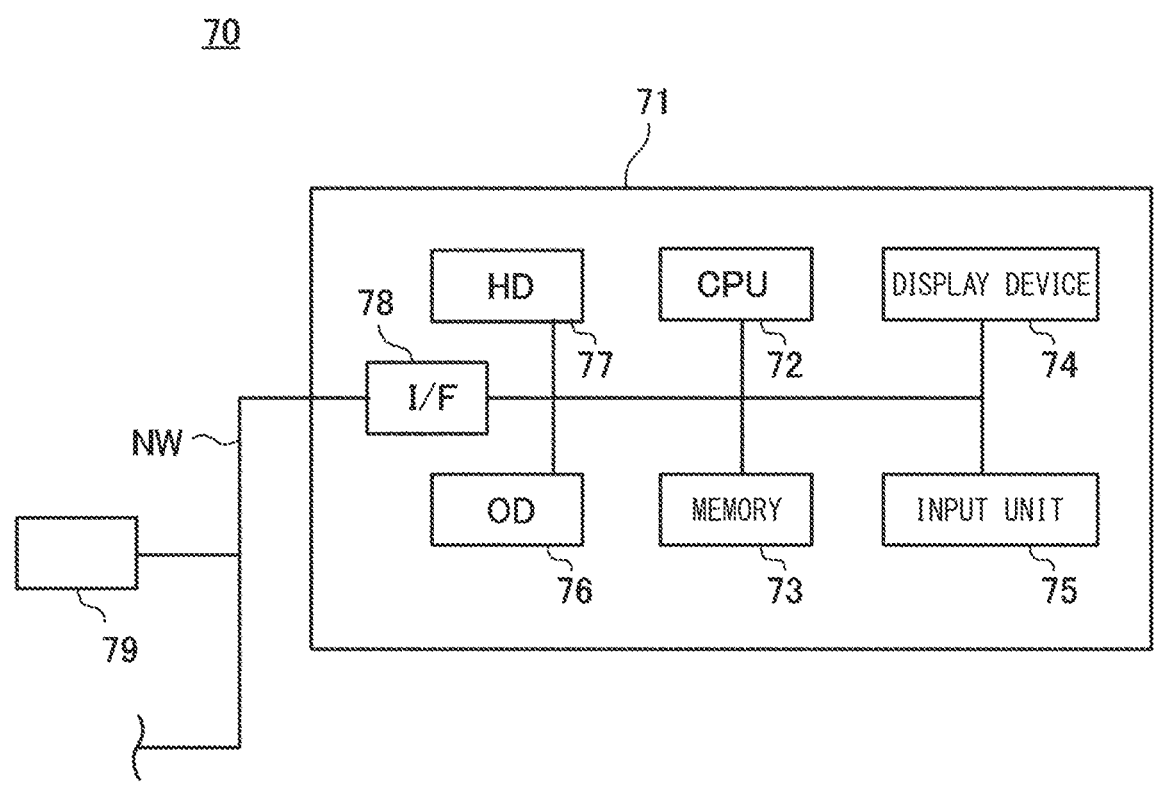
FIG. 2 is a view showing a summary of a data processing device configured to execute a mask data generation program.

FIG. 1 is a view showing a flowchart expressing a processing process of a mask data generation method of a first embodiment. The mask data generation method of the first embodiment generates mask data by causing a CPU 72 mounted in a computer 71 of the data processing device 70 to execute a mask data generation program stored in a data processing device 70 shown in FIG. 2.

Accordingly, hereinafter, the embodiment of the mask data generation method will be described by describing processing of causing the mask data generation program to control the CPU 72.

The mask data generation program (hereinafter, also simply referred to as "a program") is stored in a memory 73 or a hard disk (HD) 77 of the computer 71.

In step S101, the CPU 72 controls an interface (I/F) or the like according to the program, and loads the following first mask data that is mask data of a pixel base to the memory 73 or the HD 77. The first mask data may be read from, for example, an optical drive (OD) 76 included in the computer 71, or may be downloaded from a server 79 or a server on a communication line (not shown) via a network line NW.

Further, in each of the following steps, while the CPU 72 controls each part of the computer 71 according to the program, in the description of the following steps, the reference to the CPU 72, which is an execution subject, will be omitted.

Figure 3:
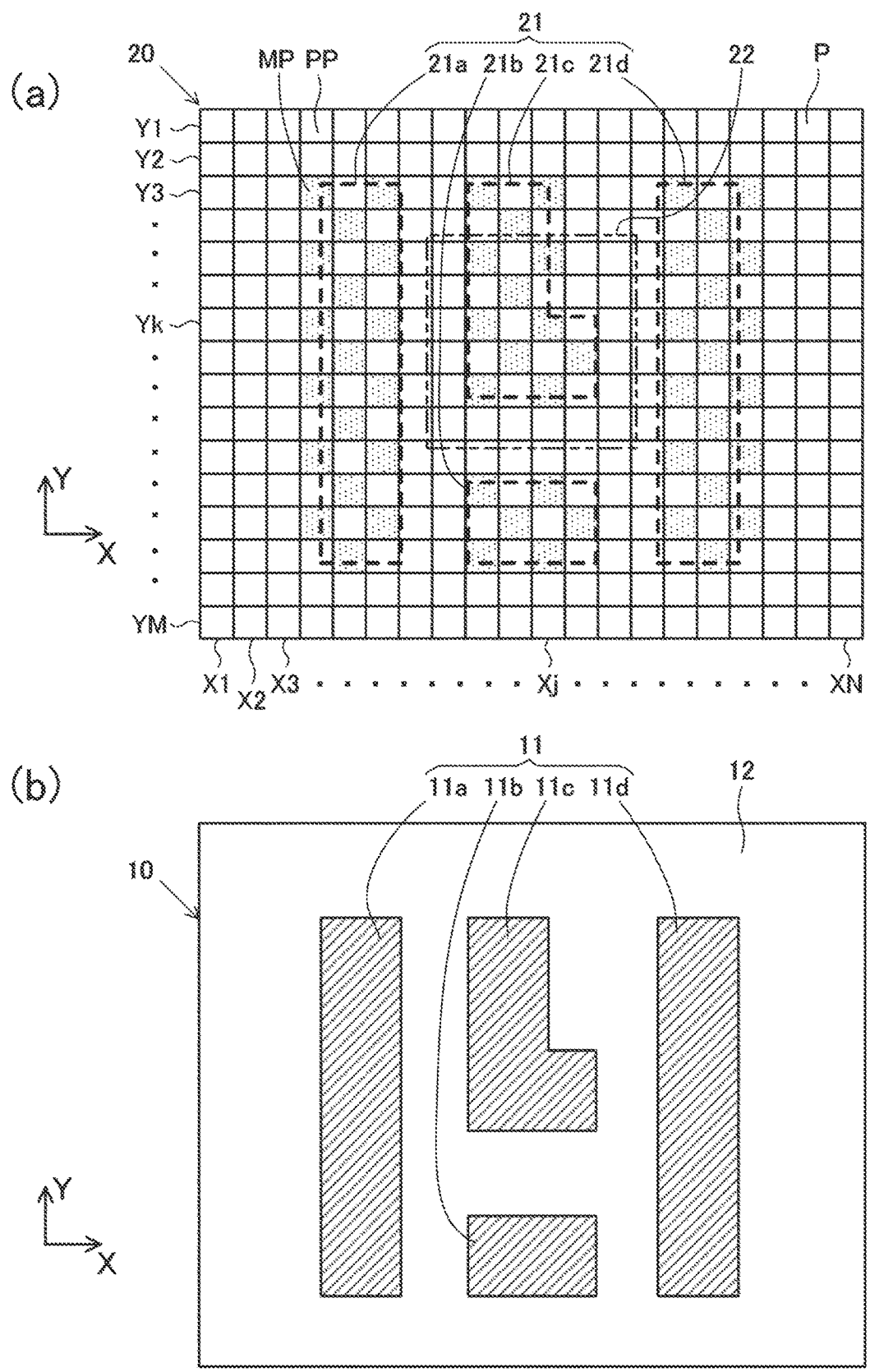
FIG. 3($a$) is a view showing an example of first mask data that is mask data of a pixel base, and FIG. 3($b$) is a view showing an example of polygon mask data, a pattern of which is consisted bya polygonal shape.

FIG. 3($a$) is a view showing an example of first mask data 20. The first mask data 20 is 2-dimensional array data (2-dimensional grid), and as an example, expresses an address of an array variable thereof as an X address (X1 to XN) and a Y address (Y1 to YM). Accordingly, a pixel P that is a unit element of the first mask data 20 is specified as P(Xj, Yk) on the 2-dimensional grid. Here, a variable range of a subscript j is a natural number of 0 or more and a natural number N or less, and a variable range of a subscript k is a natural number of 0 or more and a natural number M or less.

Here, the X address corresponds to a position on a mask (not shown) in an X direction when the first mask data 20 is formed on the mask, and the Y address corresponds to a position on the mask in a Y direction perpendicular to the X direction.

A value of each pixel P of the first mask data 20 is either +1 or −1 as an example. These values correspond to values of an amplitude of transmittance or an amplitude of reflectance of light in the mask formed using the first mask data 20.

Hereinafter, a pixel having a value of +1 (the pixel P with no dots in FIG. 3(a)) is referred to as a positive pixel PP, and a pixel having a value of −1 (the pixel P with dots in FIG. 3(a)) is referred to as a negative pixel MP. The value of the negative pixel MP is −1 times the value of the positive pixel PP.

The above-mentioned value of +1 may be referred to as a first value, and the positive pixel PP set with the value of +1 may be referred to as a first unit element. The above-mentioned value of −1 may be referred to as a second value, and the negative pixel MP set as the value of −1 may be referred to as a second unit element.

FIG. 3(b) is a view showing an example of polygon mask data 10, a pattern of which is consisted by a polygonal shape, for comparison. The polygon mask data 10 is data corresponding to a transmittance distribution of the mask as an example, and the data includes light shielding regions 11a to 11d having a low transmittance in a transmissive region 12 having a high transmittance of about 1 (100%). The light shielding regions 11a to 11d are also referred to simply as a light shielding region 11 collectively or individually.

In FIG. 3(a) showing the first mask data 20, portions of the polygon mask data 10 of FIG. 3(b) corresponding to the light shielding regions 11a to 11d are shown to be surrounded by broken lines as dimming regions 21a to 21d, respectively. The dimming regions 21a to 21d are also referred to simply as a dimming region 21 collectively or alone.

In a projection image obtained by loading the mask manufactured on the basis of the first mask data 20 on a projection exposure device, a light intensity of a portion corresponding to the dimming region 21 is decreased by interference between lights passing through the inside of the dimming region 21 and the plurality of pixels P disposed around thereof.

Accordingly, when the mask based on the first mask data 20 shown in FIG. 3(a) is used, it is possible to obtain substantially the same projection image as in the case in which the mask based on the polygon mask data 10 shown in FIG. 3(b) is used.

However, in order to obtain a more preferable projection image, it is necessary to improve the disposition of the positive pixels PP and the negative pixels MP of the first mask data 20 and more preferably dim the region of the projection image corresponding to the inside of the dimming region 21. Here, disposition of the positive pixel PP and the negative pixel MP is corrected by executing the following steps.

In step S102, first, the CPU 72 calculates an intensity distribution of the projection image obtained when the mask manufactured on the basis of the first mask data 20 is loaded in the projection exposure device (hereinafter, also simply referred to as "a projection image of the first mask data 20"). Since the calculation method of the intensity distribution of the projection image is a well-known method, description thereof will be omitted herein. Further, calculation of the intensity distribution is performed using optical conditions such as an exposure wavelength, a numerical aperture, illumination conditions, a residual aberration, and the like, of the projection exposure device in which the mask manufactured on the basis of the first mask data 20 is used. In addition, a scale of the light intensity (intensity distribution) is set such that the light intensity of the projection image corresponding to the portion in which the positive pixels PP or the negative pixels MP are distributed continuously over a plurality of areas becomes a predetermined value (for example, 1).

FIG. 4(a) is an enlarged view of a region 22 that is a portion of the first mask data 20 shown in FIG. 3(a), and FIG. 4(b) is a view showing an intensity distribution IC1 in a portion corresponding to a line segment A in FIG. 4(a) in the projection image of the calculated first mask data 20. A vertical axis I of the graph shown in FIG. 4(b) shows light intensity of the projection image.

FIG. 4(b) shows also an intensity distribution IR in the portion corresponding to the line segment A in FIG. 4(a) in the projection image obtained when the mask manufactured on the basis of the polygon mask data 10 shown in FIG. 3(b) is loaded in the projection exposure device (hereinafter, also simply referred to as "a projection image of the polygon mask data 10"). Hereinafter, the intensity distribution IR of the projection image of the polygon mask data 10 is also referred to as "the intensity distribution IR of the reference image." The intensity distribution IR of the reference image is previously calculated before step S102 is executed. Since the calculation method of the intensity distribution IR of the reference image is well known, description thereof will be omitted herein.

Further, when the intensity distribution IR of the reference image is calculated, the calculation is performed using optical conditions such as an exposure wavelength, a numerical aperture, an illumination condition, residual aberration, and the like, of the projection exposure device in which the mask is used based on the polygon mask data 10. In addition, a scale of the light intensity (intensity distribution) is set such that the light intensity of the projection image corresponding to the portion of the transmissive region 12 with a large area becomes the above-mentioned predetermined value.

Since the first mask data 20 has not been optimized for disposition of the positive pixel PP and the negative pixel MP, the intensity distribution IC1 of the projection image of the first mask data 20 is slightly deviated from the intensity distribution IR of the reference image. The deviation quantity is quantified to calculate the first evaluation value, and this value is used as a parameter that estimates a degree of optimization of the disposition of the positive pixel PP and the negative pixel 1VIP in the first mask data 20.

As the first evaluation value, for example, a sum of squares of a difference D1 between the intensity distribution IC1 of the projection image of the first mask data 20 and the intensity distribution IR of the reference image is used. That is, squares of the difference D1 between the intensity distribution IC1 of the projection image of the first mask data 20 and the intensity distribution IR of the reference image at each point (X, Y) using the X coordinates and the Y coordinates, on which the projection image of the first mask data 20 is calculated, is obtained, and a value obtained by summing the squares over the predetermined range of the X coordinate and the Y coordinate is used.

Further, while the region 22 has been exemplarily described in FIGS. 4(a) and 4(b), the first evaluation value is calculated by integrating the sum of squares of the difference D1 with the range of the X coordinate and the Y coordinate corresponding to the entire region of the X address and the Y address of the first mask data 20 shown in FIG. 3(*a*).

The first evaluation value is not limited to the sum of squares of the difference D1 between the intensity distribution IC1 of the projection image of the above-mentioned the first mask data 20 and the intensity distribution IR of the reference image. For example, the sum of squares of the difference with the value itself of the polygon mask data 10 shown in FIG. 3(*b*) may be used.

After step S103, improvement in the disposition of the positive pixel PP and the negative pixel MP is performed.

Figure 4:
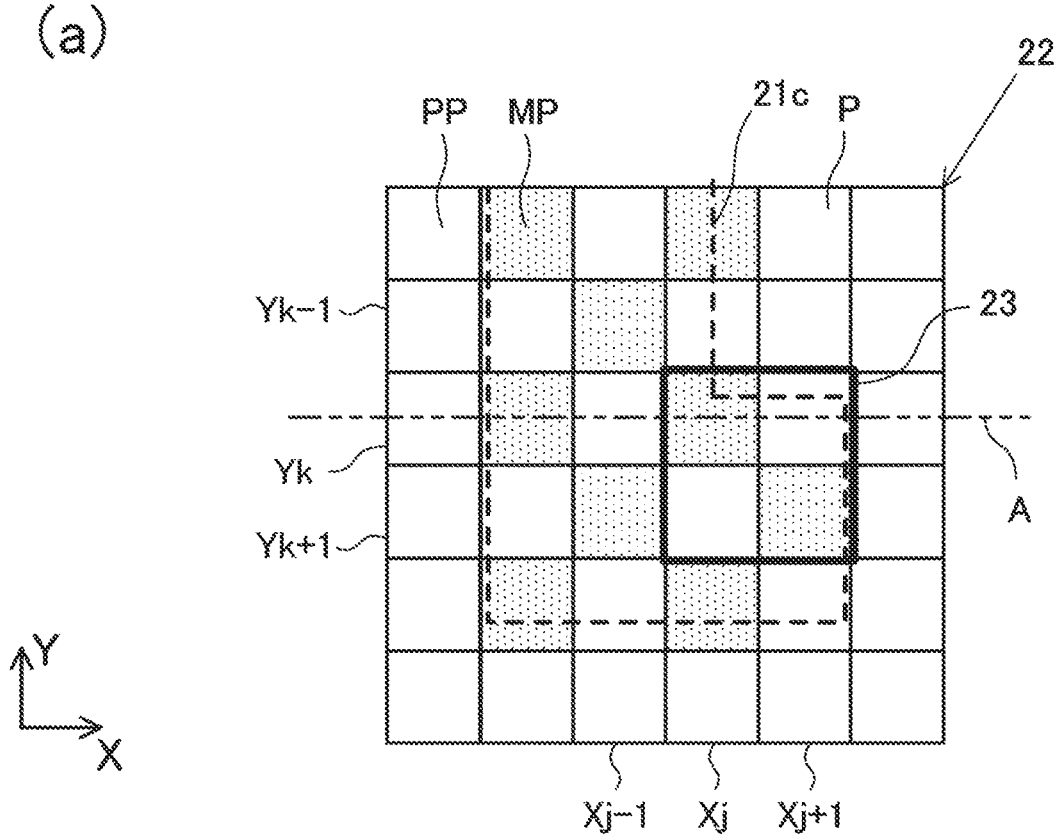
FIG. 4($a$) is an enlarged view of a part of the first mask data shown in FIG. 3($a$), and FIG. 4($b$) shows an intensity distribution of a portion corresponding to a line segment A in FIG. 4($a$) in a projection image calculated using the first mask data shown in FIG. 4($a$).
Figure 4:
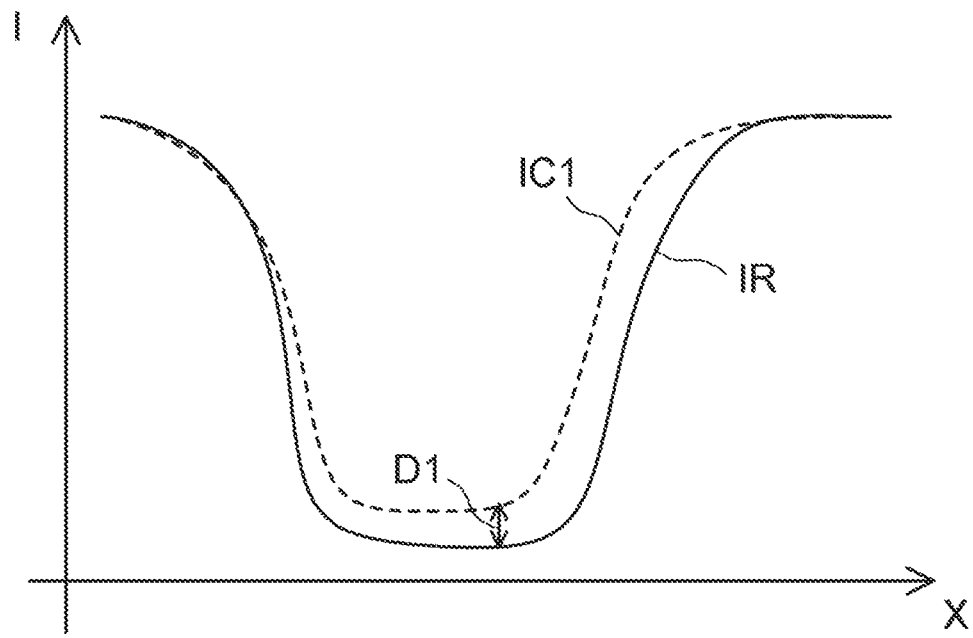

In the mask data generation method of the embodiment, as described above, improvement is performed by replacing the positive pixel PP and the negative pixel MP of the plurality of pixels P disposed within a range of interest 23 in the first mask data 20 shown in FIG. 4(*a*).

In step S103, a loop of Yk that is the Y address of the range of interest 23 is started. In the loop, Yk that is the Y address is sequentially changed from 1 to M.

In the next step S104, a loop of a value of Xj that is the X address of the range of interest 23 is started. In the loop, Xj that is the X address is sequentially changed from 1 to N.

In step S105, the CPU 72 determines whether both of the positive pixel PP and the negative pixel MP are present in the pixels P (Xj, Yk) designated by the addresses Xj and Yk on the 2-dimensional grid of the first mask data 20 and the pixels P in the vicinity thereof. The range of the vicinity in such determination is a range shown by a bold line frame as the range of interest 23 in FIG. 4(*a*), and for example, is a range including a total four pixels P of 2 rows and 2 columns of P (Xj, Yk), P (Xj, Yk+1), P (Xj+1, Yk) and P (Xj+1, Yk+1).

When both of the positive pixels PP and the negative pixels MP are present in the range of interest 23, the processing advances to step S106. Meanwhile, when both of the positive pixels PP and the negative pixels MP are not mixed, i.e., when the pixels P in the range of interest 23 are all positive pixels PP or all negative pixels MP, the processing advances to step S111.

Further, in step S105, further, it may be determined that both of the positive pixel PP and the negative pixel MP are present only when the values of P(Xj, Yk) and P(Xj+1, Yk+1) are equal to each other and the values of P(Xj, Yk+1) and P(Xj+1, Yk) are equal to each other.

In step S106, second mask data are generated by changing the value of the positive pixel PP included in the range of interest 23 of the first mask data 20 to −1 as the negative pixel MP and changing the value of the negative pixel MP to +1 as the positive pixel PP. That is, the second mask data are generated by switching disposition of the positive pixel PP and the negative pixel MP in the range of interest 23.

Figure 5:
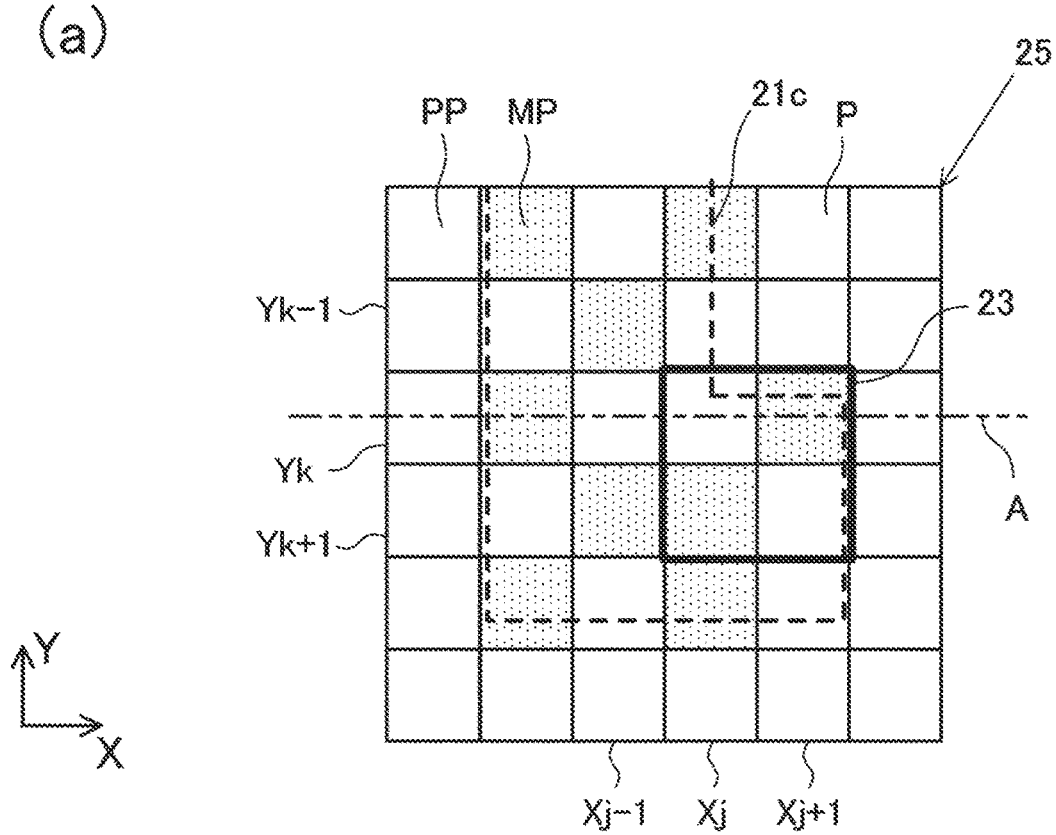
FIG. 5($a$) is a view showing second mask data in which a part of the first mask data shown in FIG. 4($a$) is changed, and FIG. 5($b$) is a view showing an intensity distribution of a portion corresponding to a line segment A in FIG. 5($a$) in a projection image obtained by calculating the second mask data shown in FIG. 5($a$).
Figure 5:
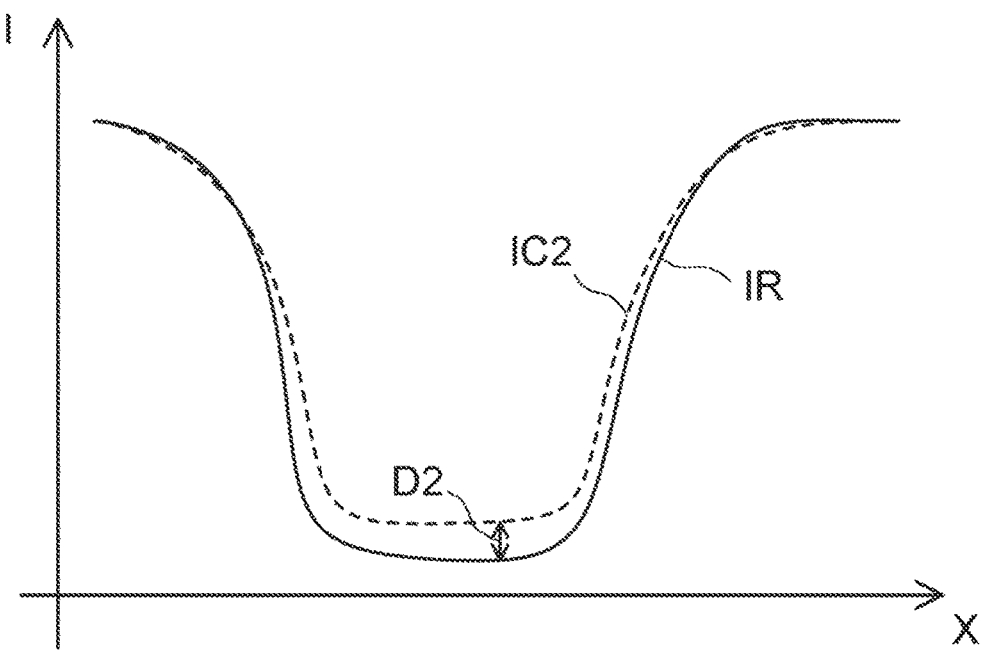

FIG. 5(*a*) is a view showing some of generated second mask data 25, and showing a portion corresponding to the region 22 that is a part of the first mask data 20 shown in FIG. 4(*a*) among the second mask data 25.

In the second mask data 25, disposition of the positive pixel PP and the negative pixel MP within the range of interest 23 is changed from disposition in the first mask data 20.

In step S107, the CPU 72 calculates an intensity distribution of the projection image obtained when the mask manufactured on the basis of the second mask data 25 is loaded in the projection exposure device (hereinafter, also simply referred to as "the projection image of second mask data 25"). The calculation method of the intensity distribution of the projection image is the same as the calculation method of the projection image of the above-mentioned first mask data 20.

Like FIG. 4(*b*), FIG. 5(*b*) is a view showing an intensity distribution IC2 in a portion corresponding to the line segment A in FIG. 5(*a*) in the projection image of the calculated second mask data 25 and an intensity distribution (an intensity distribution of the reference image) IR of the projection image of the above-mentioned polygon mask data 10.

Then, the CPU 72 calculates a second evaluation value that quantifies a separation quantity between the intensity distribution IC2 of the projection image of the second mask data 25 and the intensity distribution IR of the reference image, like calculation of the above-mentioned first evaluation value. As the second evaluation value, like the above-mentioned first evaluation value, for example, a sum of squares of a difference D2 between the intensity distribution IC2 of the projection image of the second mask data 25 and the intensity distribution IR of the reference image is used.

In step S108, the CPU 72 compares the first evaluation value and the second evaluation value. As described above, since the first evaluation value and the second evaluation value are quantities expressing separation from the reference image, among the first mask data 20 or the second mask data 25, the mask data having the smaller first evaluation value or the second evaluation value, are more preferable mask data.

Accordingly, when the second evaluation value is smaller than the first evaluation value (determination of the comparison is Yes), the second mask data 25 are more preferable mask data. Accordingly, the CPU 72 advances to step S109 and assigns the second mask data 25 to the first mask data 20. Accordingly, the first mask data 20 are rewritten to more preferable data. Then, in step S110, the CPU 72 assigns the second evaluation value to the first evaluation value. Then, the processing advances to step S111.

Meanwhile, when the second evaluation value is equal to or greater than first evaluation value in step S108 (determination of the comparison is No), since the first mask data 20 are more preferable mask data, the CPU 72 advances to step S111, without advancing to step S109 and step S110.

Step S111 is the end point of the loop of the value of Xj that is the X address of the range of interest 23, the value of Xj is increased by 1, and the processing returns to step S104 when the value of Xj is equal to or less than N and advances to step S112 when the value of Xj exceeds N.

Step S112 is the end point of the loop of the value of Yk that is the Y address of the range of interest 23, the value of Yk is increased by 1, and the processing returns to step S103 when the value of Yk is equal to or less than M and advances to step S113 when the value of Yk exceeds M.

In step S113, the CPU 72 determines whether the first evaluation value calculated in step S102 and rewritten in step S109 is smaller than the predetermined reference value. When the determination result is Yes, i.e., when the first evaluation value is smaller than the predetermined reference value, and the processing advances to step S114 as improvement of the first mask data 20 is terminated. Meanwhile, when the determination result is No, i.e., when the first evaluation value is not smaller than the predetermined reference value, improvement of the first mask data 20 is not terminated, and the processing returns to step S103.

The predetermined reference value may be input from, for example, an input unit 75 of the computer 71 by an operator or may be input from the outside via the network line NW.

In step S114, the CPU 72 outputs the first mask data as output data. An output destination of the output data may be the optical drive (OD) 76 included in the computer 71, or may be the server 79 or a server on a communication line (not shown) via the network line NW.

The mask data as the output data are generated by the following each step.

Further, the output data output in the above-mentioned step S114 is either the first mask data 20 or the second mask data 25 selected on the basis of the result of the comparison of the first evaluation value and the second evaluation value in step S108.

Further, in the above-mentioned step S105 and step S106, the range of the range of interest 23 that is the above-mentioned vicinity range is not limited to the above-mentioned four pixels P. For example, the range of the range of interest 23 that is the vicinity range may be a range including the two pixels P of P (Xj, Yk) and P (Xj, Yk+1) or P (Xj, Yk−1), or may be a range including two pixels P of P (Xj, Yk) and P (Xj+1, Yk) or P (Xj−1, Yk). Alternatively, the range may be a range including the pixel P included in the address of each range of about ±1 to ±3 in an address X direction and an address Y direction while having the P (Xj, Yk) as a center.

When the four or more pixels P are included in the range of the range of interest 23, in step S106, the values of the plurality of positive pixels PP and negative pixels MP are switched to generate the second mask data.

Further, for example, an upper limit of the range of the range of interest 23 that is the above-mentioned vicinity range is a distance of about two times a length corresponding to a length of a so-called design rule of the first mask data 20 on the 2-dimensional grid of the first mask data 20. That is, when the first mask data 20 are, for example, data for a mask of a design rule of 45 nm and the grid size is 15 nm in terms of a substrate to be exposed (wafer), the range of the range of interest 23 is a range of 2×45 nm/15 nm=6 address. This is a range of each about ±3 address in the address X direction and the address Y direction while having the P (Xj, Yk) as a center.

Further, while the above-mentioned first embodiment has a loop for Xj and Yk consisting of step S103, step S104, step S111, and step S112, the loop does not necessarily have to be provided. That is, in step S101 and step S102, the first evaluation value related to the first mask data 20 may be calculated, step S106 to step S109 with respect to the one range of interest 23 among the first mask data 20 may be executed, and then, step S114 may be executed.

Further, in the above-mentioned first embodiment, the first mask data 20 loaded in step S101 may be mask data of a pixel base optimized to some extent using the method disclosed in the above-mentioned Non Patent Literature 1. In the method disclosed in Non Patent Literature 1, in order to optimize the mask data using the simulated annealing, it takes a long time for optimization. However, the mask data can be generated for a shorter time by stopping the optimization by the method disclosed in the above-mentioned Non Patent Literature 1 to some extent, and then, applying generation of the mask data according to the above-mentioned first embodiment.

Alternatively, in the above-mentioned first embodiment, as the first mask data 20 loaded in step S101, the aggregated mask data in which the partial mask data approximately optimized for each of a plurality of dimming portions 21a to 21d included therein may be used.

In this case, in the above-mentioned first embodiment, basically, since the data of the pixel P of the portion corresponding to the vicinity of the plurality of dimming portions 21a to 21d needs to be modified, the mask data can be generated for a shorter time.

In the above-mentioned first embodiment, while the first mask data 20 and the second mask data 25 are both data that take two values of +1 and −1, there is no limitation thereto and may be data that take two values of 0 and 1. In addition, the polygon mask data 10 that is a comparison target is also not limited to the above-mentioned shading mask pattern and may be a mask pattern of a so-called phase shift mask in which the amplitude transmittance is negative with respect to the other region.

(Effects of Embodiment of Mask Data Generation Method)

(1) The embodiment of the above-mentioned mask data generation method includes calculating a first evaluation value of a projection image IC1 based on the first mask data 20 in which a first value (+1) or a second value (−1 or 0) different from the first value is set for each of the plurality of unit elements (the pixel P) that constitute the 2-dimensional grid, generating the second mask data 25 by changing a value of the first unit element (the positive pixel PP) to which the first value is set to a second value and by changing a value of the second unit element (the negative pixel MP) which is disposed close to the first unit element on the 2-dimensional grid and to which the second value is set to the first value, among the plurality of unit elements included in the first mask data 20, calculating a second evaluation value of a projection image IC2 based on the second mask data, comparing the first evaluation value and the second evaluation value, and selecting either the first mask data 20 or the second mask data 25 as the output mask data on the basis of the comparison result.

According to the configuration, it is possible to simultaneously change the values of the two or more pixels disposed close to each other in the mask data of the pixel base and improve the mask data on the basis of the changes of the evaluation value of the projection image according thereto. Accordingly, it is possible to generate the mask data at a shorter time compared to a method that rewrites the value of the one pixel in the mask data of the pixel base and that improves the mask data on the basis of the changes in the evaluation value of the projection image according thereto.

(Embodiment of Mask Data Generation Program)

As described above, in the generation method of the above-mentioned mask data using the data processing device 70, the program for realizing the above-mentioned functions is recorded on the computer-readable recording medium, and the program recorded on the recording medium is loaded into the computer 71, which is a computer system, and executed.

Further, "the computer system" disclosed herein includes an operating system (OS) or hardware such as peripheral devices. In addition, "the computer-readable recording medium" refers to a portable recording medium such as a flexible disk, a magneto-optical disk, an optical disk, a memory card, or the like, or a storage device such as a hard disk or the like installed in the computer system.

Further, "the computer-readable recording medium" may include a medium that holds a program dynamically for a short time, such as a communication circuit when the program is transmitted via a network line NW such as the Internet or the like or a communication line such as a telephone line or the like, or a medium that holds a program for a certain time, such as a volatile memory in a computer system that is a server or a client in this case.

In addition, the program may be used to realize some of the functions of the program that generates the mask data, and further, the above-mentioned function may be realized in combination with the program already recorded in the computer system.

In addition, the above-mentioned program can be provided through a recording medium such as a CD-ROM or the like, or a data signal such as the Internet or the like. For example, the computer 71 including the CPU 72 in FIG. 2, the memory 73 and a hard disk 77 receives the program via the CD-ROM loaded in the optical drive (OD).

In addition, the server 79 connected to the network line NW connected to the computer 71 functions as a server computer that provides the program, and transmits the program to a recording medium such as the memory 73, the hard disk 77, or the like, of the computer 71. That is, the program is carried as a data signal by carrier waves and transmitted via the network line NW.

In this way, the program can be supplied as various types of computer-readable computer program products such as a recording medium, carrier waves, or the like.

Further, the steps of the flowchart shown in FIG. 1 do not necessarily require the entire execution thereof.

(Effects of Embodiment of Mask Data Generation Program)

(2) The embodiment of the above-mentioned mask data program can cause the data processing device 70 including the computer 71 to perform:

storing the first mask data 20 to which a first value (+1) or a second value (−1 or 0) different from the first value is set for each of the plurality of unit elements (the pixel P) that constitute the 2-dimensional grid in the storage region;

calculating a first evaluation value of the projection image IC1 based on the first mask data 20;

generating the second mask data 25 by changing the value of the first unit element (the positive pixel PP) to which the first value is set to a second value and by changing the value of the second unit element (the negative pixel MP) which is disposed close to the first unit element on the 2-dimensional grid and to which the second value is set to the first value, among the plurality of unit elements (the pixel P) included in the first mask data 20;

calculating the second evaluation value of the projection image IC2 based on the second mask data; and comparing the first evaluation value and the second evaluation value and selecting either the first mask data 20 or the second mask data 25 as the output mask data on the basis of the comparison result.

According to the configuration, it is possible to simultaneously change the values of the two or more pixels disposed close to each other in the mask data of the pixel base and to improve the mask data on the basis of the variation in evaluation value of the projection image according thereto. Accordingly, it is possible to generate the mask data at a shorter time compared to a method that rewrites the value of the one pixel in the mask data of the pixel base and that improves the mask data on the basis of the changes in evaluation value of the projection image according thereto.

As described above, while the various embodiments and variants have been described, the present invention is not limited to the contents thereof. In addition, the embodiments and variants may be applied individually or in combination. The other aspects that can be considered within the range of the technical scope of the present invention are also included within the range of the present invention.

The disclosure of Patent Application based on the next priority is incorporated herein by reference.

Japanese Patent Application No. 2020-026419 (filed Feb. 19, 2020).

REFERENCE SIGNS LIST

10 Polygon mask data
11 Light shielding region
20 Mask data of pixel base (first mask data)
21 Dimming region
23 Range of interest
P Pixel
PP Positive pixel
MP Negative pixel
IC1, IC2 Intensity distribution of projection image
IR Intensity distribution of reference image
70 Data processing device
71 Computer
72 CPU
73 Memory
77 Hard disk (HD)

The invention claimed is:

1. A mask data generation method comprising:
calculating a first evaluation value of a projection image based on first mask data in which a first value or a second value different from the first value is set for each of a plurality of unit elements that constitute a 2-dimensional grid;
generating second mask data by changing a value of a first unit element to which the first value is set to a second value and by changing a value of a second unit element which is disposed close to the first unit element on the 2-dimensional grid and to which the second value is set to the first value, among the plurality of unit elements included in the first mask data;
calculating a second evaluation value of the projection image based on the second mask data; and
comparing the first evaluation value and the second evaluation value and selecting either the first mask data or the second mask data as output mask data on the basis of the comparison result.

2. The mask data generation method according to claim 1, wherein a change of a value of the first unit element to the second value and a change of a value of the second unit element to the first value are performed with respect to a plurality of the first unit elements and a plurality of the second unit elements.

3. The mask data generation method according to claim 1, wherein the output mask data is set as the first mask data, the second evaluation value is set as the first evaluation value when the selected output mask data is the second mask data, and
generation of the second mask data, calculation of the second evaluation value, and selection of the output mask data are repeated for a plurality of times.

4. The mask data generation method according to claim 1, wherein the second unit element is disposed close to the first unit element on the 2-dimensional grid.

5. The mask data generation method according to claim 1, wherein the second unit element is within twice a distance of a design rule of the first mask data on the 2-dimensional grid with respect to the first unit element.

6. The mask data generation method according to claim 1, wherein a technique of calculating the first evaluation value is same as that of calculating the second evaluation value.

7. The mask data generation method according to claim 6, wherein, in the same technique, either the first evaluation value or the second evaluation value is calculated on the basis of a difference between an intensity distribution of a reference image and an intensity distribution of the projection image of the first mask data or the second mask data.

8. The mask data generation method according to claim 1, wherein the first value and the second value are value related to amplitude transmittance or amplitude reflectance of light in a mask, and the second value is −1 times the first value.

9. The mask data generation method according to claim 1, wherein the first value and the second value are values related to amplitude transmittance or amplitude reflectance of light in a mask, and
one of the first value and the second value is 0.

10. The mask data generation method according to claim 2, wherein the output mask data is set as the first mask data,
the second evaluation value is set as the first evaluation value when the selected output mask data is the second mask data, and
generation of the second mask data, calculation of the second evaluation value, and selection of the output mask data are repeated for a plurality of times.

11. The mask data generation method according to claim 10, wherein the second unit element is disposed close to the first unit element on the 2-dimensional grid.

12. The mask data generation method according to claim 11, wherein the second unit element is within twice a distance of a design rule of the first mask data on the 2-dimensional grid with respect to the first unit element.

13. The mask data generation method according to claim 12, wherein a technique of calculating the first evaluation value is same as that of calculating the second evaluation value.

14. The mask data generation method according to claim 13, wherein, in the same technique, either the first evaluation value or the second evaluation value is calculated on the basis of a difference between an intensity distribution of a reference image and an intensity distribution of the projection image of the first mask data or the second mask data.

15. The mask data generation method according to claim 14, wherein the first value and the second value are value related to amplitude transmittance or amplitude reflectance of light in a mask, and
the second value is −1 times the first value.

16. The mask data generation method according to claim 14, wherein the first value and the second value are values related to amplitude transmittance or amplitude reflectance of light in a mask, and
one of the first value and the second value is 0.

17. A mask data generation program configured to cause a data processing device including a computer to perform:
storing first mask data to which a first value or a second value different from the first value is set for each of a plurality of unit elements that constitute a 2-dimensional grid in a storage region;
calculating a first evaluation value of a projection image based on the first mask data;
generating second mask data by changing a value of a first unit element to which the first value is set to a second value and by changing a value of a second unit element which is disposed close to the first unit element on the 2-dimensional grid and to which the second value is set to the first value, among the plurality of unit elements included in the first mask data;
calculating a second evaluation value of a projection image based on the second mask data; and
comparing the first evaluation value and the second evaluation value and selecting either the first mask data or the second mask data as output mask data on the basis of the comparison result.

18. The mask data generation program according to claim 17, wherein a change of a value of the first unit element to the second value and a change of a value of the second unit element to the first value are performed with respect to a plurality of the first unit elements and a plurality of the second unit elements.

19. The mask data generation program according to claim 17, wherein the output mask data is set as the first mask data,
the second evaluation value is set as the first evaluation value when the selected output mask data is the second mask data, and
generation of the second mask data, calculation of the second evaluation value, and selection of the output mask data are repeated for a plurality of times.

20. The mask data generation program according to claim 17, wherein the second unit element is disposed close to the first unit element on the 2-dimensional grid.

21. The mask data generation program according to claim 17, wherein the second unit element is within twice a distance of a design rule of the first mask data on the 2-dimensional grid with respect to the first unit element.

22. The mask data generation program according to claim 18, wherein the output mask data is set as the first mask data,
the second evaluation value is set as the first evaluation value when the selected output mask data is the second mask data, and
generation of the second mask data, calculation of the second evaluation value, and selection of the output mask data are repeated for a plurality of times.

23. The mask data generation program according to claim 22, wherein the second unit element is disposed close to the first unit element on the 2-dimensional grid.

24. The mask data generation program according to claim 23, wherein the second unit element is within twice a distance of a design rule of the first mask data on the 2-dimensional grid with respect to the first unit element.

* * * * *